(12) United States Patent
Ball et al.

(10) Patent No.: US 7,689,958 B1
(45) Date of Patent: Mar. 30, 2010

(54) PARTITIONING FOR A MASSIVELY PARALLEL SIMULATION SYSTEM

(75) Inventors: Michael S. Ball, La Mesa, CA (US); Cristina N. Cifuentes, Atherton, CA (US); Deepankar Bairagi, Davis, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 526 days.

(21) Appl. No.: 10/997,196

(22) Filed: Nov. 24, 2004

Related U.S. Application Data

(60) Provisional application No. 60/524,517, filed on Nov. 24, 2003.

(51) Int. Cl.
G06F 17/50 (2006.01)
(52) U.S. Cl. .......................................................... 716/7
(58) Field of Classification Search ..................... 716/1, 716/2, 7
See application file for complete search history.

(56) References Cited

U.S. PATENT DOCUMENTS

| | | | |
|---|---|---|---|
| 6,708,325 | B2 | 3/2004 | Cooke et al. |
| 6,832,357 | B2* | 12/2004 | Saluja et al. .................. 716/2 |
| 2002/0095666 | A1 | 7/2002 | Tabata et al. |
| 2003/0037319 | A1* | 2/2003 | Narang ........................ 717/144 |

OTHER PUBLICATIONS

Fiduccia, C. M. et al.; "A Linear-Time Heuristic for Improving Network Partitions"; Proceedings of the 19th IEEE Design Automation Conference, 1982, pp. 241-247.
Karypis, G.; "Multilevel Algorithms for Multi-Constraint Hypergraph Parittioning"; Technical Report 99-034, University of Minnesota, Dept. of Computer Science, 1999, pp. 1-10.
Karypis, G. et al.; "A Fast and High Quality Multilevel Scheme for Partitioning Irregular Graphs"; Technical Report 95-035, University of Minnesota, Dept. of Computer Science, 1995, pp. 1-28.
Kernighan, B.W. et al.; "An Efficient Heuristic Procedure for Partitioning Graphs"; The Bell System Technical Journal, 49(2):291-307, 1970.
Khan, A.A. et al.; "A Comparison of Multiprocessor Scheduling Heuristics"; Technical Report 9307, Auburn University, Dept. of Computer Science and Engineering, 1993, pp. 0-29.
McCreary, C.L. et al.; "The Problem With Critical Path Scheduling Algorithms"; Technical Report 9601, Auburn Univeristy, Dept. of Computer Science and Engineering, 1996, pp. 0-20.

(Continued)

*Primary Examiner*—Vuthe Siek
(74) *Attorney, Agent, or Firm*—Osha • Liang LLP

(57) ABSTRACT

A method involves building an intermediate form data flow graph (IFgraph) from an intermediate form data flow tree (IFtree) associated with the logic design, partitioning the IFgraph across at least three levels of granularity to obtain a partitioned IFgraph, wherein partitioning the IFgraph involves balancing a set of nodes of the IFgraph into a first subset and a second subset, wherein each of the first subset and second subset are within a predefined constraint of the cycle-based system, and wherein the balancing is performed on at least one of the levels of granularity, and rewriting the IFtree based on the partitioned IFgraph.

33 Claims, 8 Drawing Sheets

OTHER PUBLICATIONS

Vahld, F.' "Partitioning Sequential Programs for CAD Using a Three-Step Approach"; ACM Transactions on Design Automation of Electronic Systems, 7(3) :413-429, Jul. 2002.

Gupta, A.; "Fast and Effective Algorithms for Graph Partitioning and Sparse-Matrix Ordering"; IBM Journal of Research and Development; vol. 41, No. 1/2, 1997; pp. 1-17.

Hocevar, Dale E. et al.; "Top-Down Design Using Cycle Based Simulation: an MPEG A/V Decoder Example"; DSPS R&D Center, Texas Instruments, Inc., 1998, pp. 1-7.

Ha, S.; "Compile-Time Scheduling and Assignment of Data-Flow Program Graphs with Data-Dependent Iteration"; IEEE Transactions on Computers, vol. 40, No. 11, Nov. 1991; pp. 1225-1238.

* cited by examiner

PARTITIONING FOR A MASSIVELY PARALLEL SIMULATION SYSTEM

CROSS-REFERENCE TO RELATED APPLICATIONS

This application claims benefit from Provisional Application No. 60/524,517 filed on Nov. 24, 2003 entitled "Partitioning for a Massively Parallel Simulation System".

BACKGROUND

Massively parallel processing (MPP) environments are computer environments that operate using a massive number of processors. It is typical for an MPP environment to use tens of thousands of processors. Each processor in such an environment is able to execute computer instructions at the same time which results in a very powerful system since many calculations take place simultaneously. Such an environment is useful for a wide variety of purposes. One such purpose is for the software simulation of a hardware design.

Large logic simulations are frequently executed on parallel or massively parallel computing systems. For example, parallel computing systems may be specifically designed parallel processing systems or a collection, referred to as a "farm," of connected general purpose processing systems. FIG. 1 shows a block diagram of a typical parallel computing system (100) used to simulate an HDL logic design. Multiple processor arrays (112a, 112b, 112n) are available to simulate the HDL logic design. A host computer (116), with associated data store (117), controls a simulation of the logic design that executes on one or more of the processor arrays (112a, 112b, 112n) through an interconnect switch (118). The processor arrays (112a, 112b, 112n) may be a collection of processing elements or multiple general purpose processors. The interconnect switch (118) may be a specifically designed interconnect or a general purpose communication system, for example, an Ethernet network.

A general purpose computer (120) with a human interface (122), such as a graphical user interface (GUI) or a command line interface, together with the host computer (116) support common functions of a simulation environment. These functions typically include an interactive display, modification of the simulation state, setting of execution breakpoints based on simulation times and states, use of test vectors files and trace files, use of HDL modules that execute on the host computer and are called from the processor arrays, check pointing and restoration of running simulations, the partitioning of a logic design, and single execution of a clock cycle.

The software simulation of a hardware logic design involves using a computer program to cause a computer system to behave in a manner that is analogous to the behavior of a physical hardware device. Software simulation of a hardware logic design is particularly beneficial because the actual manufacturing of a hardware device can be expensive. Software simulation allows the user to determine the efficacy of a hardware design. Software simulation of a hardware logic design is well-suited for use in an MPP environment because hardware normally performs many activities simultaneously.

In an MPP environment, an individual logic design modeling a physical hardware device can be simulated on a potentially large number of parallel processing arrays. Before the logic design is able to execute, the design is partitioned into many small parts, one part per processor array.

Code partitioning in a compiler typically uses one of two classes of partitioning algorithms: (1) critical path scheduling, and (2) multi-level k-way partitioning (MLKP). Critical path scheduling algorithms place the largest critical paths first, and the shortest critical paths last. In this way, large paths get scheduled first, followed by other paths in decreasing critical path length. Critical path algorithms generally do not consider or do not model the communication overhead between the processors, when scheduling paths across processors. MLKP algorithms are based on the observation that bisection algorithms are able to optimize a small set of nodes. Therefore, the input graph is "collapsed" into a smaller graph that is then partitioned.

Once code is partitioned, each part is scheduled for a corresponding processor array or multiple processor arrays and routed to execute on a simulation system. Scheduling involves both timing and resource availability issues of the processor array executing a node (i.e., a gate or a HDL statement).

A partitioning solution should obtain the minimum runtime of the logic design. According to current schemes, two criteria are used to measure the quality of a partitioning solution: (1) the degree of parallelism of the parts in the partition, and (2) the amount of inter-processor communication. The degree of parallelism is the number of parts in a partition that can be executed simultaneously. The degree of parallelism alone, however, is not enough to guarantee a fast overall simulation time of the circuit because communication cost limits the contribution of parallelism to the overall simulation time. The inter-processor communication results in a communication cost (sometimes referred to as overhead) between the processor arrays. The ratio of computation time and communication time is used as a quantitative measure, i.e., the time the processor array spends on computation over the time the processor array spends on communication.

SUMMARY OF INVENTION

In general, in one aspect, the invention relates to a method for partitioning a logic design for a cycle-based system. The method comprises building an intermediate form data flow graph (IFgraph) from an intermediate form data flow tree (IFtree) associated with the logic design, partitioning the IFgraph across at least three levels of granularity to obtain a partitioned IFgraph, wherein partitioning the IFgraph comprises balancing a set of nodes of the IFgraph into a first subset and a second subset, wherein each of the first subset and second subset are within a predefined constraint of the cycle-based system, and wherein the balancing is performed on at least one of the levels of granularity, and rewriting the IFtree based on the partitioned IFgraph.

In general, in one aspect, the invention relates to a computer system to partition a logic design for a cycle-based system. The computer system comprises a processor, a memory, and software instructions. The software instructions are stored in the memory for enabling the computer system under control of the processor to build an intermediate form data flow graph (IFgraph) from an intermediate form data flow tree (IFtree) associated with the logic design, partition the IFgraph across at least three levels of granularity to obtain a partitioned IFgraph, wherein partitioning the IFgraph comprises balancing a set of nodes of the IFgraph into a first subset and a second subset, wherein each of the first subset and second subset are within a predefined constraint of the cycle-based system, and wherein the balancing is performed on at least one of the levels of granularity, and rewrite the IFtree based on the partitioned IFgraph.

In general, in one aspect, the invention relates to a compiler to compile a logic design of a cycle-based design. The compiler comprises a partitioner configured to accept as input an intermediate form data flow graph (IFgraph) from an intermediate form data flow tree (IFtree) associated with the logic design, partition the IFgraph across at least three levels of granularity to obtain a partitioned IFgraph, wherein partitioning the IFgraph comprises balancing a set of nodes of the IFgraph into a first subset and a second subset, wherein each of the first subset and second subset are within a predefined constraint of the cycle-based system, and wherein the balancing is performed on at least one of the levels of granularity; and rewrite the IFtree based on the partitioned IFgraph, and a scheduler configured to schedule a node associated with the IFgraph on a processor array.

In general, in one aspect, the invention relates to a plurality of nodes. The plurality of nodes comprise a partitioner configured to accept as input an intermediate form data flow graph (IFgraph) from an intermediate form data flow tree (IFtree) associated with the logic design, partition the IFgraph across at least three levels of granularity to obtain a partitioned IFgraph, wherein partitioning the IFgraph comprises balancing a set of nodes of the IFgraph into a first subset and a second subset, wherein each of the first subset and second subset are within a predefined constraint of the cycle-based system, and wherein the balancing is performed on at least one of the levels of granularity, and rewrite the IFtree based on the partitioned IFgraph; and a scheduler configured to schedule the set of nodes of the IFgraph on a processor array, wherein the partitioner is located on at least one of the plurality of nodes, and wherein the scheduler is executing on at least one of the plurality of nodes.

Other aspects of the invention will be apparent from the following description and the appended claims.

DETAILED DESCRIPTION

Figure 1:
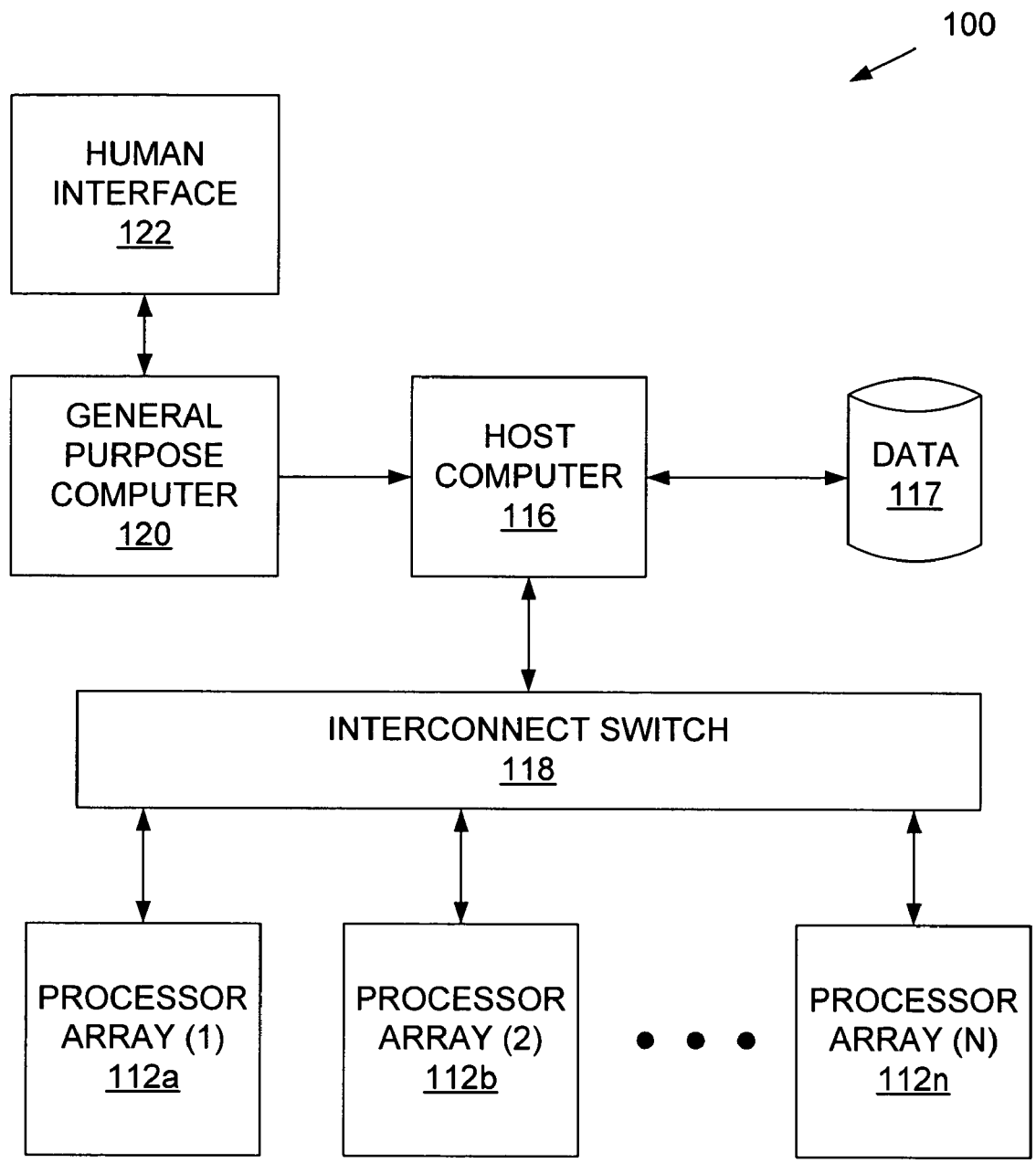
FIG. 1 shows a typical parallel computer system.

Specific embodiments of the invention will now be described in detail with reference to the accompanying figures. Like elements in the various figures are denoted by like reference numerals for consistency.

The present invention involves a method and apparatus for partitioning a logic design for a cycle-based simulation system. In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 2:
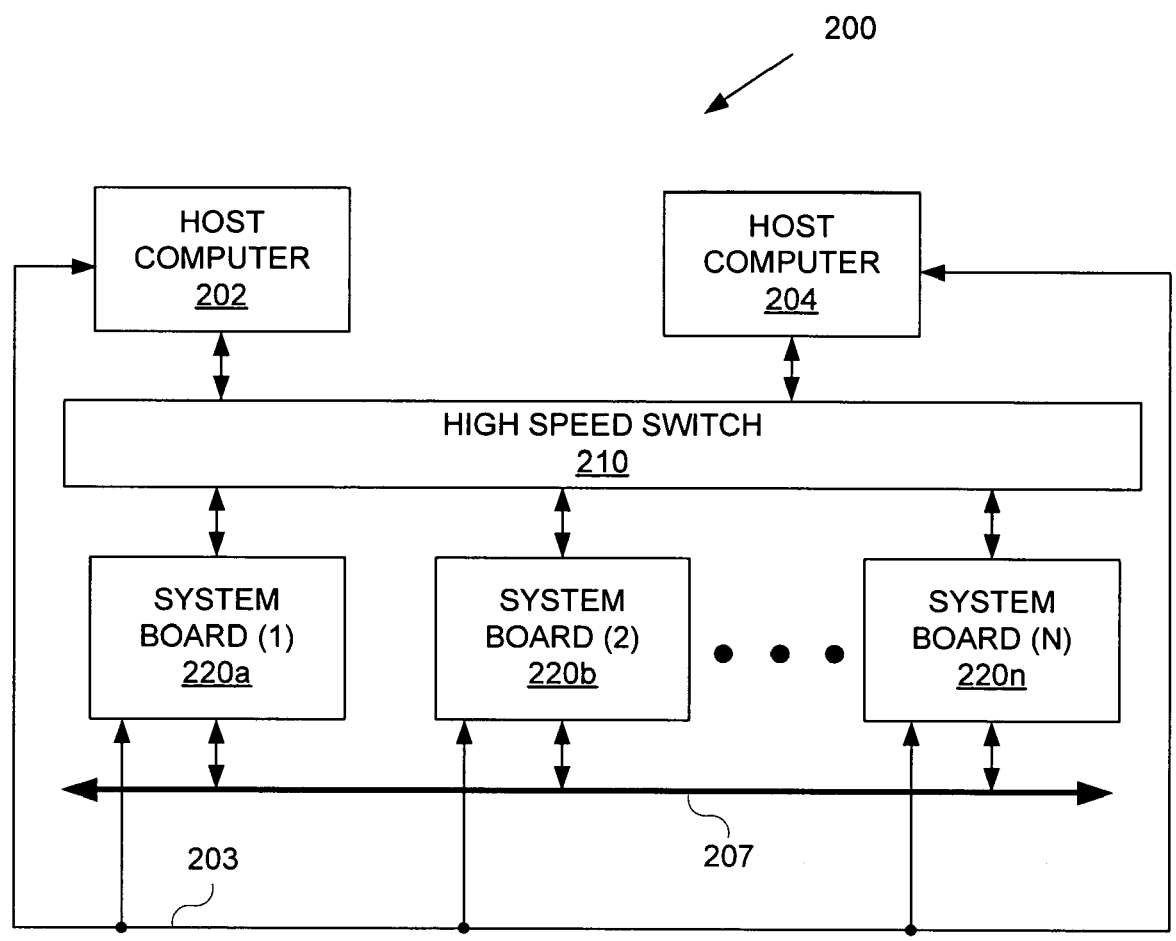
FIG. 2 shows a parallel computer system in accordance with one embodiment of the present invention.
Figure 3:
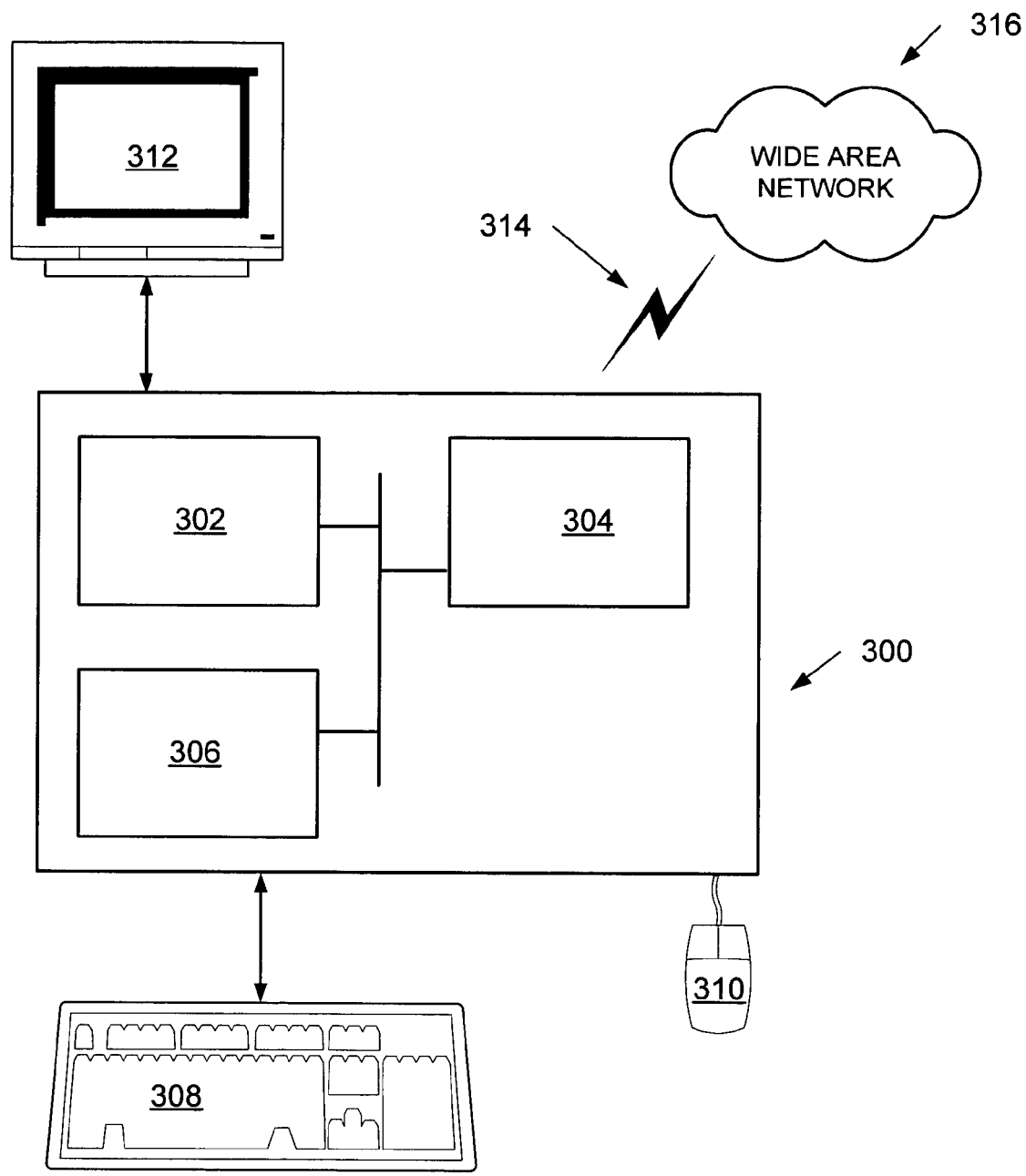
FIG. 3 shows a general purpose computer system in accordance with one embodiment of the present invention.

A computer execution environment and a class of simulation systems, e.g., multiple instruction, multiple data (MIMD), used with one or more embodiments of the invention is described in FIGS. 2-3. In an embodiment of the present invention, the computer execution environment may use execution processors to execute execution processor code on a general purpose computer, such as a SPARC™ workstation produced by Sun Microsystems, Inc., or specialized hardware for performing cycle-based computations.

The system on which a compiled hardware logic design may be executed in one or embodiments of the invention is a massively parallel, cycle-based computing system. The system uses an array of execution processors arranged to perform cycle-based computations. One example of cycle-based computation is simulation of a cycle-based design written in a computer readable language, such as HDL (e.g., Verilog, etc.), or a high-level language (e.g., Occam, Modula, C, etc.).

FIG. 2 shows exemplary elements of a massively parallel, cycle-based computing system (200), in accordance with one or more embodiments of the present invention. Cycle-based computation, such as a logic simulation on the system (200), involves one or more host computers (202, 204) managing the logic simulation(s) executing on one or more system boards (220a, 220b, 220n). Each system board contains one or more Application Specific Integrated Circuits (ASIC). Each ASIC contains multiple execution processors, e.g., an 8-processor sub-cluster having a sub-cluster crossbar that connects to eight execution processors. The execution processors are capable of executing custom instructions that enable cycle-based computations, such as specific logic operations (e.g., four input, one output Boolean functions, etc.). Each ASIC may also connect to external memory in the form of static random access memory (SRAM) through a SRAM interface (SRI).

The host computers (202, 204) may communicate with the system boards (220a, 220b, 220n) using one of several pathways. The host computers (202, 204) include interface hardware and software as needed to manage a logic simulation. A high speed switch (210) connects the host computers (202, 204) to the system boards (220a, 220b, 220n). The high speed switch (210) is used for loading and retrieval of state information from the execution processors located on ASICs on each of the system boards (220a, 220b, 220n). The connection between the host computers (202, 204) and system boards (220a, 220b, 220n) also includes an Ethernet connection (203). The Ethernet connection (203) is used for service functions, such as loading a program and debugging. The system also includes a backplane (207). The backplane (207) allows the ASICs on one system board to communicate with the ASICs of another system board (220a, 220b, 220n) without having to communicate with an embedded controller located on each system board. Additional system boards may be added to the system by connecting more system boards to the backplane (207).

In one or more embodiments of the present invention, the computer execution environment to perform partitioning of a logic design in a cycle-based, logic simulation system may be a general purpose computer, such as a SPARC™ workstation produced by Sun Microsystems, Inc. For example, as shown in FIG. 3, a typical general purpose computer (300) has a processor (302), associated memory (304), a storage device (306), and numerous other elements and functionalities typical to today's computers (not shown). The computer (300) has associated therewith input means such as a keyboard (308) and a mouse (310), although in an accessible environment these input means may take other forms. The computer (300) is also associated with an output device such as a display device (312), which may also take a different form in an accessible environment. The computer (300) is connected via a connection means (314) to a Wide Area Network (WAN)

(316). The computer (300) may be interface with a massively parallel, cycle-based computing system described above and as shown in FIG. 2.

Further, those skilled in the art will appreciate that one or more elements of the aforementioned computer system (300) may be located at a remote location and connected to the other elements over a network. Further, the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. Further, software instructions to perform embodiments of the invention may be stored on a computer readable medium such as a compact disc (CD), a diskette, a tape, a file, or any other computer readable storage device.

The computer systems described above are for purposes of example only. Embodiments of the invention may be implemented in any type of computer system or programming or processing environment.

A partitioning solution attempts to assign each of the simulation instructions and variables of execution processor code associated with a logic design to a unique processor array in such a way that: (1) the total number of message passes is minimized; (2) the total latency of all operations and messages on the data interconnect paths and particularly the critical (longest) computational path through the design is minimized; and (3) resource and capacity constraints within any processor array or routing processor are not exceeded. In one embodiment of the invention a partitioning solution, attempting to satisfy these requirements, incorporates a bottom-up, multi-level approach (e.g., a MLKP algorithm).

Figure 4:
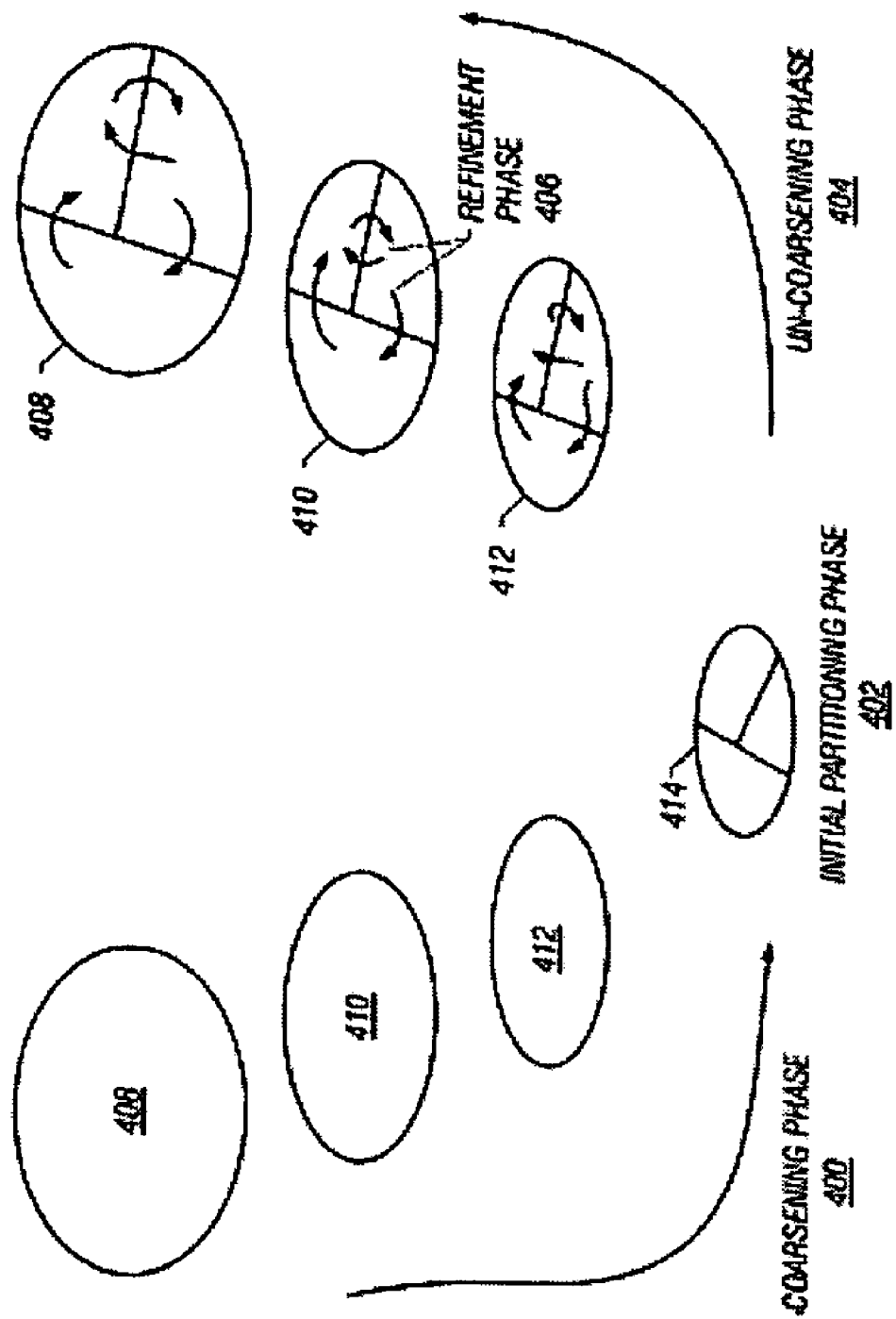
FIG. 4 shows a flow diagram of multi-level partitioning algorithm in accordance with one embodiment of the invention.

FIG. 4, in accordance with one or more embodiments of the invention, shows a flow diagram of the partitioning solution, which has three main phases: Coarsening, Initial Partitioning, and Uncoarsening and Refinement. An initial task of a partitioner, as part of the partitioning solution, involves identifying an intermediate form data flow graph (referred to herein as "IFgraph"). Each oval in FIG. 4 represents an IFgraph containing intermediate form data flow nodes (referred to herein as "IFnodes") (not shown), where each IFgraph is within a different level of the graph hierarchy.

Next, in the coarsening phase (Step 400), the coarsening of IFgraph (408) compresses the information needed to represent IFgraph (408) resulting in the coarser IFgraph (410). Similarly, IFgraph (410) compresses the information needed to represent IFgraph (410) resulting in the coarser IFgraph (412). In one embodiment of the invention, the result of the coarsening phase (Step 400) is IFgraph (414).

In one embodiment of the invention, IFgraph (414) is partitioned, using a recursive bisection of the resulting coarsened graph (e.g., IFgraph (414)), which is represented by two line segments within the IFgraph (414). In one embodiment of the invention, the uncoarsening phase (Step 404) maps back the IFgraphs, while the refinement phase (Step 406) improves the number of edges by minimizing edges across partitions. For example, IFgraph (414) is uncoarsened forming IFgraph (412'). IFgraph (412') "inherits" the partitions established in the initial partitioning phase. Similarly, the IFgraph (412') is uncoarsened forming IFgraph (410'), where IFgraph (410') has the partitions established by IFgraph (412'). The IFgraph (408') is also formed from uncoarsening (410') and IFgraph (408') has partitions established by IFgraph (410'). The refinement phase (Step 406) is represented by a series of arrows contained within IFgraph (412'), IFgraph (410'), and IFgraph (408'), indicating improvements in the quality of partitions previously created.

The partitioning solution described above (and shown in FIG. 4) may be used by a compiler to partition code for various types of computer execution environments and classes of simulation systems, such as the massively parallel cycle-based computing system shown in FIG. 2 and described above. A description of how the partitioning solution may be used by a compiler to partition a logic design for such a computing system follows.

In one embodiment of the invention, a compiler associated with a massively parallel cycle-based computing system may be a cycle-based compiler for Verilog register transfer language (RTL) code, where the logic is evaluated at the end of each cycle instead of at each change of state of a component. The cycle-based compiler is structured similar to a standard programming-language compiler, with a front-end portion, an intermediate representation, and a back-end portion.

The front-end portion of the compiler reads Verilog source files and produces an intermediate representation called the Elaborated Verilog Data Base (EDB). The front-end portion reorders the code to satisfy cycle-based rules, insuring that logic dependent on the clock, such as flip flops and latches, is implemented prior to combinational logic based on their outputs. Essentially, the front-end portion determines the execution order of the RTL components for simulations, thus imposing an order of the Verilog code. The resulting EDB contains explicit ordering and dependency data.

The back-end portion of the compiler then traverses this data structure and produces Intermediate Format (IF) code. The back-end portion also performs global data dependency analysis and dataflow optimizations on an intermediate form data flow tree (referred to herein as "IFtree"). The back-end portion also converts the IF code into machine instructions for a particular system. During this conversion process, the IFtree is partitioned into boards, chips and processors, the instructions are scheduled within the processors, and data is routed through the multiple levels of a crossbar for the massively parallel cycle-based computing system interconnect.

When a compiler generates machine code for any particular computer system, it needs to satisfy the physical constraints of that system. For example, a given system may have the following constraints:

1. Each processor has 1024 64-bit words that can be used as instructions or data;
2. Each processor has 120 32-bit registers and 256 bit-registers;
3. Each chip has 64 processors;
4. Each chip has 2 MB of SRAM;
5. Each crossbar routing processor has 4 KB for router instructions, except for I/O ports which have 8 KB;
6. Each board has 64 chips; and
7. Each system has N boards×64 chips×64 processors available.

The characteristics of the massively parallel cycle-based computing system hardware (described above) and the size of the input hardware description language (e.g., Verilog, etc.) designs, make the problem of partitioning code in a compiler a challenging one. Traditionally compilers for hardware description languages, such as Verilog, make take hours or even days to compile a complete processor design.

The input size of hardware designs may be as large as 1.5 million nodes. A multi-processor system of 2 or 4 processors involves 3 to 6 million nodes. The sheer size of these designs requires that the compiler uses efficient algorithms and data structures, because memory requirements during compilation can be very high.

In one embodiment of the invention, the size of the logic design requires collapsing of the nodes in the graph to reduce its size, such that partitioning solutions (incorporating algorithms like MLKP) can be effectively applied. Further, the hierarchical nature of massively parallel cycle-based computing systems lends itself to partitioning at different levels of granularity.

Figure 5:
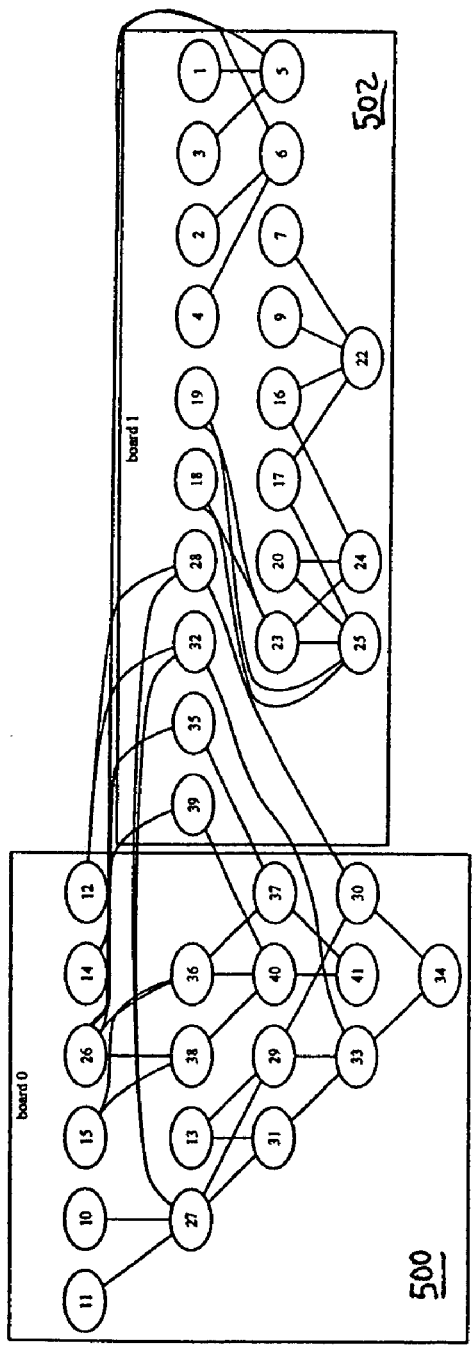
FIGS. 5-7 shows nodes partitioned across various levels of granularity in accordance with one embodiment of the invention.
Figure 6:
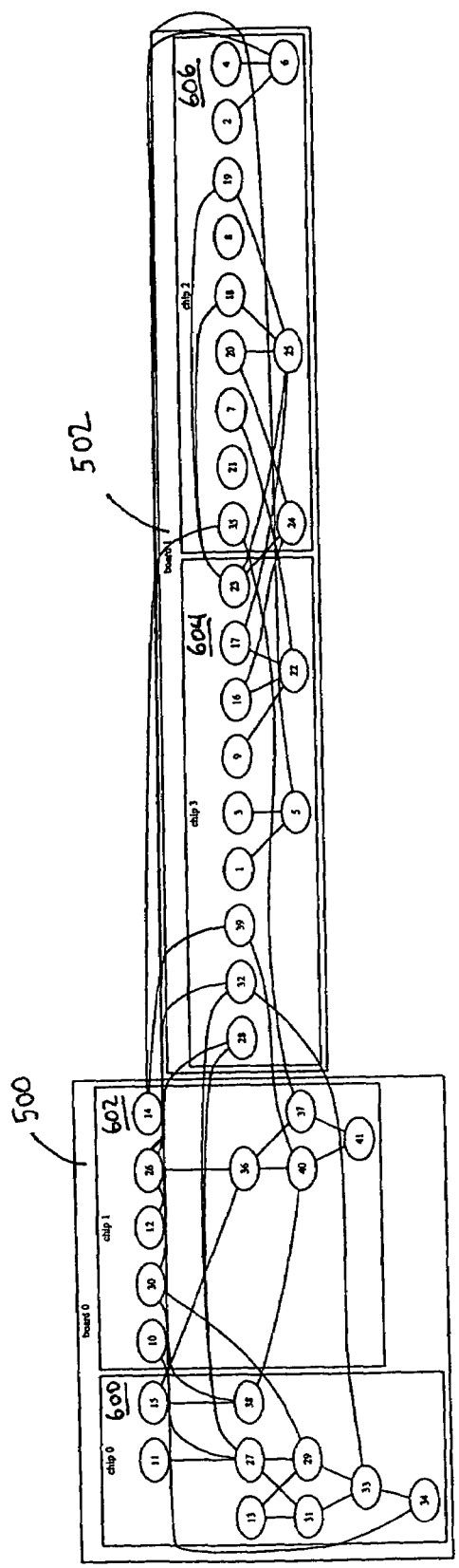
Figure 7:
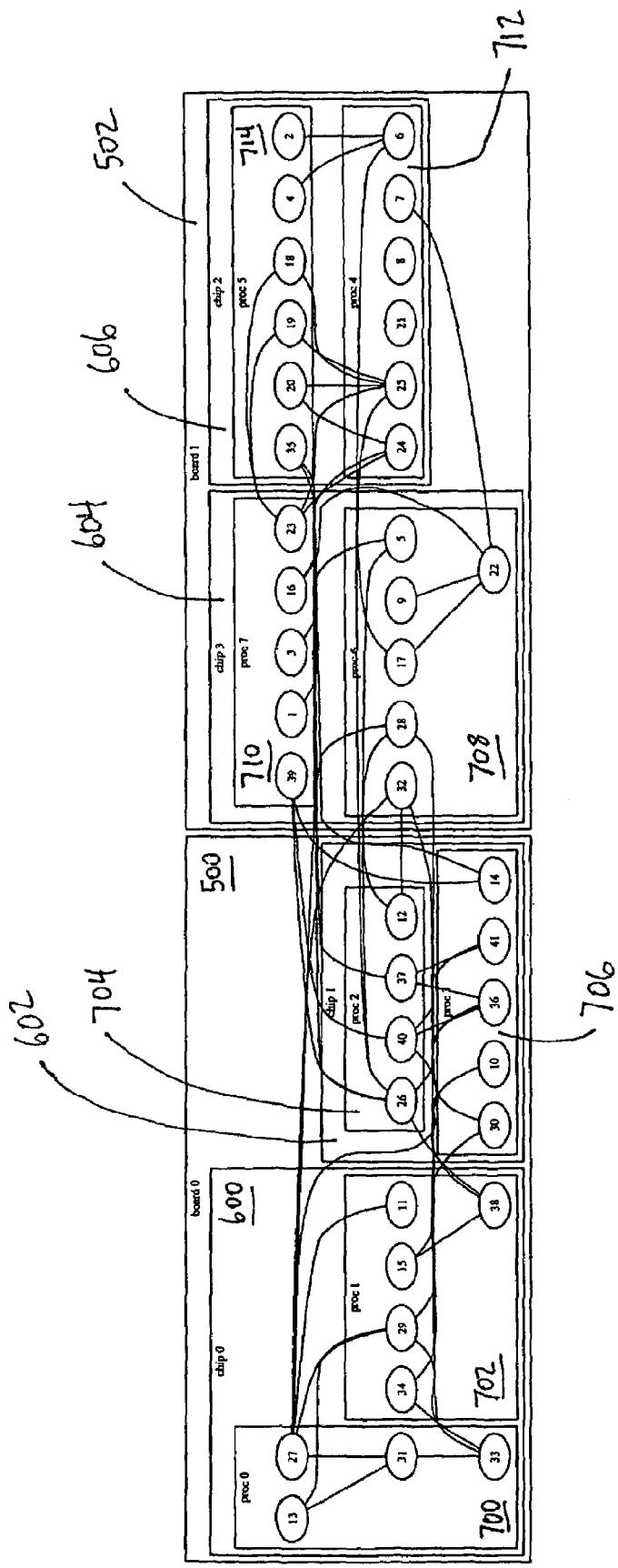

Massively parallel cycle-based computing system hardware may have at least four levels of interconnection, where partitioning (incorporating algorithms like MLKP) may be performed at three different levels of granularity, such as the board, the chip, and the processor levels. In other words, a logic design may be partitioned into 2 boards, and then each board is partitioned into 4 chips. Finally, each chip may be partitioned into 8 processors. For example, as shown in FIG. 5, the logic design is represented by multiple IFnodes of an IFgraph being partitioned onto separate boards in accordance with one embodiment of the invention. Specifically, the IFnodes are partitioned onto board 0 (500) and board 1 (502). Next, as shown in FIG. 6, the IFnodes are further partitioned onto chips in accordance with one embodiment of the invention. Specifically, the IFnodes are partitioned onto chip 0 (600) and chip 1 (602), both on board 0 (500), and chip 3 (604) and chip 2 (606), both on board 1 (502). Finally, as shown in FIG. 7, the IFnodes are further partitioned by processor in accordance with one embodiment of the invention. Specifically, IFnodes are partitioned on proc 0 (700) and proc 1 (702), both on chip 0 (600); IFnodes are partitioned on proc 2 (704) and proc 3 (706), both on chip 1 (602); IFnodes are partitioned on proc 6 (708) and proc 7 (710), both on chip 3 (604); and IFnodes are partitioned on proc 4 (712) and proc 5 (714), both on chip 2 (606).

In one embodiment of the invention, partitioning may also be performed at the fourth level of interconnection, namely the sub-cluster level. However, given the small communication overhead available between processors in a subcluster, partitioning at this level of granularity may not be necessary.

At each level of granularity, partitioning (incorporating algorithms such as MLKP) is performed to allow for like communication costs to be partitioned more effectively. Therefore, the partitioning solution requires extensions to the MLKP algorithm for different levels of granularity, due to the nature of the machine and the logic designs.

Code Sample 1 shows pseudo-code for the extended partitioning solution, which is able to partition a massively parallel cycle-based computing system into N boards, each board into N chips, and each chip into N processors in accordance with one embodiment of the invention.

Code Sample 1

```
partition_system (IF tree)
{
    build graph G from IF tree
    partition by boards (G)
    rewrite IF tree based on G
} partition_by_boards (graph G)
{
    partition sram (G)
    partitions P=partition (G)
    for (all partitions p of P) do
        partition by chips (p, G)
} partition_by_chips (partition p, graph G)
{
    CG=subgraph (G, p)
    partition large-sized nodes (CG)
    partitions CP=partition (CG)
    for (all partitions cp of CP) do
        partition by processors (cp, CP)
} partition_by_processors (partition cp, graph CG)
{
    PG=subgraph (CG, cp)
    partition large-sized nodes (PG)
    partitions PP=partition (PG)
    for (all partitions pp of PP) do
        place partitioned nodes of PG
} partitions*partition (graph G)
{
    graphs CGs=coarsening (G)
    partition P=
    initial partition (coarser graph (CGs))
    balance infeasible partitions (P)
    uncoarsen and refinement (P, CGs)
}
```

Those skilled in the art will appreciate that the aforementioned pseudo-code may be written in any programming language.

Figure 8:
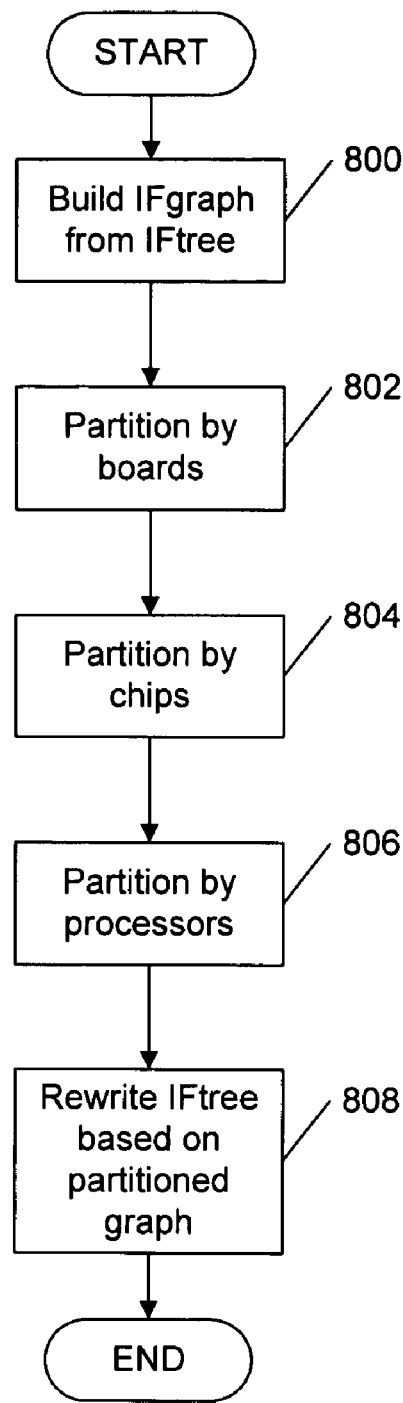
FIG. 8 shows a flow chart of an extended portioning solution in accordance with one embodiment of the invention.

FIG. 8 shows a flowchart of the extended partitioning solution in accordance with one embodiment of the present invention. In Step 800, an initial task involves building an IFgraph suitable for partitioning from an IFtree (i.e., intermediate form data flow tree). In one embodiment of the invention, the IFgraph is implemented as a linked structure on a C++ heap. By using such a heap structure, a variety of operations required during code generation and scheduling is possible.

The IFtree is typically produced by the front-end portion of the compiler and intermediate optimizations are performed on the IFtree, such as performing operations to unroll all loops in the code. Each node in the IFgraph to be partitioned includes one or more IFtree nodes. Basically, the compiler allows a variable to reside in exactly one processor. Therefore, writes (or stores) to a variable are grouped together with its definition because there is no way to perform writes from another processor. Such groups are atomic and are generally considered as one node in the graph to be partitioned.

While the IFgraph to be used by the partitioner is built, the amount of resources consumed by the nodes in the IFtree is estimated. The resources (based on the constraints of a computer system) include memory (data and instruction) capacity, register capacity, bit-register capacity, SRAM capacity, number of routing-processor instructions, etc. Some of these resources, e.g., memory, are primarily imposed by the physical characteristics of the computer system executing the code. In an embodiment of the invention, a user can control the resources through a command line option.

Based on the estimated resources in the IFgraph, the number of boards that are needed may be computed, by taking the resource with the largest requirement and dividing it into the maximum capacity for that resource in a board. Moreover, the estimates for a set of nodes are used to determine whether the nodes meet the resource constraints during bisectioning or refinement processes. Since partitioning precedes routing, instruction scheduling, and register allocation, the estimates are often very conservative to leave enough margin of error so that hard constraints like memory and registers are not exceeded during later phases of code generation. For example, based on the edges of the partitioned IFgraph, send and receive instruction may be added while rewriting the IFtree, after partitioning has been completed. Further, the nop or wait instructions may be added by the scheduler, if no other instruction is available. Therefore, the partitioner conservatively estimates that each instruction will have one other instruction before it and doubles the amount of memory needed. Similarly, for register and bit-registers, the partitioner estimates registers consumed by variable as well as temporaries as that depends on the schedule. Furthermore, the operands of an instruction can arrive from another processor through a receive and the partitioner heuristically estimates registers for such an instruction.

Referring back to FIG. 8, partitioning the IF graph for the massively parallel cycle-based computing system is performed at three different levels of granularity in accordance with one embodiment of the present invention. Specifically, recursion is used to partition at the board level using the IFgraph (Step 802), then partition at the chip level (Step 804), and then the processor level (Step 806). Specifically, within each level of granularity, the Coarsening phase, the Initial Partitioning phase, and the Un-coarsening and Refinement phases of the extended partitioning solution are performed using recursion, as shown in Code Sample 1 and described below. Finally, once the partitioning is completed for the three different levels of granularity, the IFtree is rewritten based on the newly partitioned graph (Step 808).

While partitioning as shown in FIG. 8, consideration of large-sized nodes may be required. The graph used in the extended partitioning solution allows multiple IFtree nodes to be merged into one IF graph node (described above). For some designs, a large number of IFtree nodes may end up being represented in the one graph node, leading to heavy resource requirements for that node. A number of nodes whose resources are comparable to those available in a single processor are commonly found.

Sample 1 shows an example of a large-sized node in accordance with one embodiment of the invention.

Sample 1

Graph nodeID: 133447, weight=(2080, 16, 1)

IF nodeID: $462746, opcode=MEM, width=16384

IF nodeID: $1252331, opcode=REFX, width=16

IF nodeID: $1252334, opcode=STOREIF, width=0

IF nodeID: $3828369, opcode=REFX, width=16

IF nodeID: $3828370, opcode=LOAD, width=16

Specifically, Sample 1 shows a spliced array that may be placed onto a processor. The spliced array requires 16384 bits (2048 bytes) of storage (memory used in a processor). A reference into that spliced array, of a store and load, are grouped with the spliced array, leading to requirements of 2080 memory bytes, 16 registers and 1 bit-register. The large memory requirement (2080 out of the 8192 bytes available in a processor) makes this node a large-sized node. Large-sized nodes need to be taken into account separately because they adversely affect any bisection algorithm used to balance like nodes during the initial partitioning phase. One of the partitions will often end up being too heavy. As a general rule of thumb, a large-sized node is one where at least one of the resource requirements is 20% the size of the available processor resources.

The partitioner avoids this problem by partitioning large-sized nodes in a separate process prior to the normal partitioning. The large-sized nodes are distributed across the processors using a round-robin list, so that they do not create heavy partitions at the processor level. Large-sized nodes get preallocated at both the chip and processor levels.

The coarsening phase of the extended partitioning solution coarsens a board's IFgraph, which may include as many as 500 vertices in its graph. The sequence of coarsened graphs may be stored in a stack of graphs, which can, if two coarsened graphs are very similar, combine the changes into a single graph resulting in a memory savings.

In one embodiment of the invention, the coarsening phase used while partitioning each level of granularity may use a heavy edge matching algorithm and coarsening of graphs is performed while the number of nodes in the graph is greater than 500 and while the difference between a graph and its coarsened graph is greater than three percent (i.e., coarsening stops when no significant changes in the code result).

In one embodiment of the invention, a greedy bisection partitioning technique is used in the Initial Partitioning phase of the extended partitioning solution. The greedy bisection algorithm selects a node at random, places it in the selected partition, computes the edge reduction change for every unselected node on the boundary, and then selects the node with the largest change, updating the boundary as needed. If no more connected nodes exist, or the weight criterion in not yet met, another node is randomly chosen. Once we have an initial partitioning, the graphs are uncoarsened to map back the graphs prior to coarsening.

After uncoarsening the finest graph, and prior to refinement of that graph, an extra pass may be performed over the nodes in the graph in an attempt to balance constraints of infeasible partitions in accordance with one embodiment of the invention. A partition is said to be infeasible if the register or bit-register resources that it consumes are larger than the physical resources available for the partition (whether the partition is at the processor, chip, or board level). Infeasible partitions can be created by the bisection process that creates the initial partitions. To balance the constraints of infeasible partitions, the heaviest node of the resource that is most imbalanced in a given infeasible partition is identified. Next, an attempt is made to swap this node with a node from another partition that consumes fewer resources. The attempt is successful if the target partition remains feasible and the imbalance in the infeasible partition is reduced. Sometimes more than one node may need to be moved in order to make an infeasible partition feasible. This process involves an exhaustive comparison of nodes. However, only a few partitions are infeasible, typically about three percent of the total number of partitions, so the time cost is not prohibitive.

In one embodiment of the invention, a greedy refinement scheme is used following the uncoarsening and balancing of infeasible portions (if necessary). During greedy refinement, random nodes are chosen from the boundary of the IFgraph and the gain/loss of moving the node to each of the other partitions is determined. The partition that results in the largest gain while still meeting tolerance and constraints/requirements of the system is chosen. If no partition has a sufficient gain, moves that result in a 0 gain are considered that will ideally improve the balance (i.e., the total magnitude of the errors in weight of the two partitions). The result is improving the number of edges by minimizing edges across partitions.

The multiple constraint nature of the partitioning a massively parallel cycle-based computing system sometimes makes it very hard for the bisectioning process to balance all constraints, especially since all the constraints have comparable magnitudes and complexities. Balancing is a strategy to keep the intermediate partitions within constraints as the IFgraph is partitioned during recursive bisection. Bisectioning divides a set of nodes into two subsets of equal size (or to a specific proportion), which are evenly balanced in all the constraints. Achieving a good balance in each level of bisectioning is important because the repetitive application of bisectioning to get a k-way partitioning causes any imbalance to be magnified. The tendency is to place the entire imbalance into one of the final partitions.

This problem is also not trivial because the nodes usually do not have proportionate amounts of the different resources. Fortunately, enough nodes typically exist in a set that the algorithm should be able to find a reasonable balance in linear complexity. Balancing is guided by a normalized error function which measures the normalized vector distance of resources between the two subsets during bisection. For example, if the cumulative weight of three resources on one subset is (A, B, C), the weight of resources on the other subset is (X, Y, Z), and the limiting constraints are ($W_1$, $W_2$, $W_3$), then the error is:

$$E=\text{sqrt}[((A-X)/W_1)^2+((B-Y)/W_2)^2+((C-Z)/W_3)]^2$$

To consider moving a node from one subset to another, we compute the new weights of the subsets (A', B', C') and (X', Y', Z') and a new error quantity:

$$E'=\text{sqrt}[((A'-X)/W_1)^2+((B'-Y)/W_2)^2+((C'-Z')/W_3)]^2$$

If E'<E, the node movement is carried out. By applying a non-linear multiplier to each component of the distance, the balance among the components is improved. That is, if any one error component is disproportionately large, we increase the error still further to give the algorithm an incentive to reduce it.

For example, the goal of a system is to divide a set of nodes into two bisections, namely partition one and partition two with constraints of (256,128,32) each. The eight nodes in this example have the following resources: Node 1 (32,3,0); Node 2 (16, 64, 0); Node 3 (32,3,0); Node 4 (16,1,0), Node 5 (16, 8,0); Node 6 (16,64,0); Node 7 (16,64,0); and Node 8 (16,32, 0), where each tuple represents (memory capacity, register capacity, bit-register capacity). In the following steps weight (partition x) represent the cumulative weight of all nodes in partition x. Partition one is empty and all nodes are in partition two. Nodes 1, 2, 3, 4, 5, and 6 are added to partition 1 to improve the balance, as follows:

Partition one={1, 2, 3, 4, 5, 6}

Partition two={7, 8}

Weight (partition one)=(112,79,0)

Weight (partition two)=(48,160,0)

Error E=0.519179

Weight (partition one+Node 6)=(128,185,0)

Weight (partition two−Node 6)=(32,96,0)

New error E'=0.394995

In this example, there is a non-linear penalty in registers for partition one as it exceed the constraint. Still, because E' is less than E, the movement of node 6 is performed. However, when Node 7 (16,64,0) is added, the results are as follows:

Error E=0.394995

Weight (partition one+Node 7)=(144,269,0)

Weight (partition two−Node 7)=(16,32,0)

New error E'=0.958943

In this example, the move of Node 7 from partition two to partition one is rejected. After rejecting 8, an attempt is made to move back a node from partition one to partition two to improve balance. Accordingly, Nodes 1, 3, and 5 are moved back to partition two, in that order. Next, an attempt to improve the balance is performed by moving nodes from partition two to partition one and Node 3 is moved back to partition one. Finally, the follow result are achieved:

Partition one={2, 3, 4, 6}

Partition two={7, 8, 1, 5}

Weight (partition one)=(80,132,0)

Weight (partition two)=(80,107,0)

In one embodiment of the invention, a different partitioning scheme than that shown in FIG. 8 is used for SRAM storage. SRAM storage is attached to a specific chip, and is accessed by sending messages through the SRAM routing processor. Therefore, no messages are sent across SRAMs, so partitioning to reduce edges is not suitable. While the IFgraph is still created, the partitioning by granularity is not performed on data partitioned in SRAM. Instead, the data is partitioned in SRAMs using a separate pass that sorts the IFnodes that contain SRAM data in inverse weight order (i.e., from larger to smaller) and maintain a list of SRAM nodes sorted by available space. The order of nodes is kept stored using a heap, so an even distribution of SRAM across the chips is automatic.

In one embodiment of the invention, the extended partitioning solution for a massively parallel machine and a large set of input data associated with a logic design allows multiple invocations of a multi-level algorithm to model hierarchical machine interconnect, handles hard multiple pre-defined constraints, has the ability to partition graphs of irregular granularity, and efficiently use data structures to provide partitions of reasonable quality efficiently in spite of large input graphs.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for partitioning a logic design for a cycle-based system, comprising:
building, using a processor of a computer, an intermediate form data flow graph (IFgraph) from an intermediate form data flow tree (IFtree) associated with the logic design;
partitioning the IFgraph for each of at least three levels of hardware granularity of the cycle-based system to obtain a partitioned IFgraph, wherein the partitioning, using the processor of the computer, of the IFgraph comprises:
coarsening the IFgraph to obtain a coarsened IFgraph for a first level of the at least three levels of hardware granularity;

balancing a set of nodes of the coarsened IFgraph for the first level into a first subset and a second subset to obtain a balanced IFgraph for the first level;

uncoarsening the balanced IFgraph for the first level to obtain an uncoarsened balanced IFgraph for the first level;

coarsening the uncoarsened balanced IFgraph for the first level to obtain a coarsened IFgraph for a second level of the at least three levels of hardware granularity;

balancing a set of nodes of the coarsened IFgraph for the second level into a third subset and a fourth subset to obtain a balanced IFgraph for the second level;

uncoarsening the balanced IFgraph for the second level to obtain an uncoarsened balanced IFgraph for the second level;

coarsening the uncoarsened balanced IFgraph for the second level to obtain a coarsened IFgraph for a third level of the at least three levels of hardware granularity;

balancing a set of nodes of the coarsened IFgraph for the third level into a fifth subset and a sixth subset to obtain a balanced IFgraph for the third level; and uncoarsening the balanced IFgraph for the third level to obtain the partitioned IFgraph, wherein the first subset and the second subset are each within a predefined constraint of the cycle-based system, and wherein the predefined constraint comprises at least one selected from the group consisting of memory capacity, register capacity, bit-register capacity, static random access memory (SRAM) capacity, and number of processor instructions; and rewriting the IFtree based on the partitioned IFgraph.

2. The method of claim 1, wherein the balancing is performed during a recursive bisection of the IFgraph.

3. The method of claim 2, wherein the balancing comprises using a normalized error function measuring a normalized vector distance of resources between the first subset and the second subset.

4. The method of claim 1, wherein the at least three levels of hardware granularity of the cycle-based system comprise a board level, a chip level, and a processor level of the cycle-based system.

5. The method of claim 1, wherein the set of nodes of the IFgraph comprises a plurality of nodes containing SRAM data, the method further comprising:

sorting the plurality of nodes in inverse weight order to obtain a list of SRAM nodes, wherein the list is sorted based on available space in each of the SRAM nodes in the list and distributed across the partitioned IFgraph.

6. The method of claim 1, further comprising:

preallocating a node of the IFgraph, wherein the node comprises at least one resource requirement that is at least twenty percent the size of a predefined processor resource.

7. The method of claim 6, wherein the preallocating is performed using a round-robin list.

8. The method of claim 6, wherein the preallocating is performed on at least one level of granularity selected from the group consisting of a chip level and a processor level.

9. The method of claim 1, further comprising:

balancing predefined constraints of an infeasible partition of the IFgraph, wherein balancing predefined constraints of the infeasible partition of the IFgraph comprises:

identifying a heaviest node of a resource that is most imbalanced in the infeasible partition; and swapping the heaviest node with a lighter node from another partition of the IFgraph until the infeasible partition may be partitioned.

10. The method of claim 1, wherein each node in the set of nodes of the IFgraph comprises at least one node of the IFtree.

11. The method of claim 1, further comprising:

determining a number of boards of the cycle-based system required for the logic design based on an estimate of resources consumed by the set of nodes of the IFgraph.

12. The method of claim 1, wherein partitioning the IFgraph comprises:

performing an extended multi-level k-way partitioning of the IFgraph.

13. The method of claim 1, further comprising:

unrolling all loops in code associated with the logic design.

14. A computer system to partition a logic design for a cycle-based system, comprising:

a processor;

a memory; and software instructions stored in the memory for enabling the computer system under control of the processor to:

build an intermediate form data flow graph (IFgraph) from an intermediate form data flow tree (IFtree) associated with the logic design;

partition the IFgraph for each of at least three levels of hardware granularity of the cycle-based system to obtain a partitioned IFgraph, wherein the partitioning of the IFgraph comprises:

coarsening the IFgraph to obtain a coarsened IFgraph for a first level of the at least three levels of hardware granularity;

balancing a set of nodes of the coarsened IFgraph for the first level into a first subset and a second subset to obtain a balanced IFgraph for the first level;

uncoarsening the balanced IFgraph for the first level to obtain an uncoarsened balanced IFgraph for the first level;

coarsening the uncoarsened balanced IFgraph for the first level to obtain a coarsened IFgraph for a second level of the at least three levels of hardware granularity;

balancing a set of nodes of the coarsened IFgraph for the second level into a third subset and a fourth subset to obtain a balanced IFgraph for the second level;

uncoarsening the balanced IFgraph for the second level to obtain an uncoarsened balanced IFgraph for the second level;

coarsening the uncoarsened balanced IFgraph for the second level to obtain a coarsened IFgraph for a third level of the at least three levels of hardware granularity;

balancing a set of nodes of the coarsened IFgraph for the third level into a fifth subset and a sixth subset to obtain a balanced IFgraph for the third level; and uncoarsening the balanced IFgraph for the third level to obtain the partitioned IFgraph, wherein the first subset and the second subset are each within a predefined constraint of the cycle-based system, and wherein the predefined constraint comprises at least one selected from the group consisting of memory capacity, register capacity, bit-register capacity, static random access memory (SRAM) capacity, and number of processor instructions; and rewrite the IFtree based on the partitioned IFgraph.

15. The computer system of claim 14, wherein the balancing is performed during a recursive bisection of the IFgraph.

16. The computer system of claim 15, wherein the balancing comprises using a normalized error function measuring a normalized vector distance of resources between the first subset and the second subset.

17. The computer system of claim 14, wherein the at least three levels of hardware granularity of the cycle-based system comprise a board level, a chip level, and a processor level of the cycle-based system.

18. The computer system of claim 14, wherein the set of nodes of the IFgraph comprises a plurality of nodes containing SRAM data, the computer system further comprising software instructions stored in the memory for enabling the computer system under control of the processor to:
 sort the plurality of nodes in inverse weight order to obtain a list of SRAM nodes, wherein the list is sorted based on available space in each of the SRAM nodes in the list and distributed across the partitioned IFgraph.

19. The computer system of claim 14, further comprising software instructions stored in the memory for enabling the computer system under control of the processor to:
 preallocate a node of the IFgraph, wherein the node comprises at least one resource requirement that is at least twenty percent the size of a predefined processor resource.

20. The computer system of claim 14, further comprising software instructions stored in the memory for enabling the computer system under control of the processor to:
 balance predefined constraints of an infeasible partition of the IFgraph, wherein balancing predefined constraints of the infeasible partition of the IFgraph comprises:
  identifying a heaviest node of a resource that is most imbalanced in the infeasible partition; and
  swapping the heaviest node with a lighter node from another partition of the IFgraph until the infeasible partition may be partitioned.

21. The computer system of claim 14, wherein each node in the set of nodes of the IFgraph comprises at least one node of the IFtree.

22. The computer system of claim 14, further comprising software instructions stored in the memory for enabling the computer system under control of the processor to:
 determine a number of boards of the cycle-based system required for the logic design based on an estimate of resources consumed by the set of nodes of the IFgraph.

23. The computer system of claim 14, wherein software instructions stored in the memory for enabling the computer system under control of the processor to partition the IFgraph comprises software instructions stored in the memory for enabling the computer system under control of the processor to:
 perform an extended multi-level k-way partitioning of the IFgraph.

24. The computer system of claim 14, further comprising software instructions stored in the memory for enabling the computer system under control of the processor to:
 unroll all loops in code associated with the logic design.

25. A compiler to compile a logic design of a cycle-based system, comprising:
 a partitioner configured to:
  accept as input an intermediate form data flow graph (IFgraph) from an intermediate form data flow tree (IFtree) associated with the logic design;
  partition the IFgraph for each of at least three levels of hardware granularity of the cycle-based system to obtain a partitioned IFgraph, wherein the partitioning of the IFgraph comprises:
   coarsening the IFgraph to obtain a coarsened IFgraph for a first level of the at least three levels of hardware granularity;
   balancing a set of nodes of the coarsened IFgraph for the first level into a first subset and a second subset to obtain a balanced IFgraph for the first level;
   uncoarsening the balanced IFgraph for the first level to obtain an uncoarsened balanced IFgraph for the first level;
   coarsening the uncoarsened balanced IFgraph for the first level to obtain a coarsened IFgraph for a second level of the at least three levels of hardware granularity;
   balancing a set of nodes of the coarsened IFgraph for the second level into a third subset and a fourth subset to obtain a balanced IFgraph for the second level;
   uncoarsening the balanced IFgraph for the second level to obtain an uncoarsened balanced IFgraph for the second level;
   coarsening the uncoarsened balanced IFgraph for the second level to obtain a coarsened IFgraph for a third level of the at least three levels of hardware granularity;
   balancing a set of nodes of the coarsened IFgraph for the third level into a fifth subset and a sixth subset to obtain a balanced IFgraph for the third level; and
   uncoarsening the balanced IFgraph for the third level to obtain the partitioned IFgraph,
   wherein the first subset and the second subset are each within a predefined constraint of the cycle-based system, and
   wherein the predefined constraint comprises at least one selected from the group consisting of memory capacity, register capacity, bit-register capacity, static random access memory (SRAM) capacity, and number of processor instructions; and
  rewrite the IFtree based on the partitioned IFgraph; and
 a scheduler configured to schedule a node associated with the IFgraph on a processor array.

26. The compiler of claim 25, wherein the balancing is performed during a recursive bisection of the IFgraph.

27. The compiler of claim 26, wherein the balancing comprises using a normalized error function measuring a normalized vector distance of resources between the first subset and the second subset.

28. The compiler of claim 25, wherein the at least three levels of hardware granularity of the cycle-based system comprise a board level, a chip level, and a processor level of the cycle-based system.

29. The compiler of claim 25, wherein each node in the set of nodes of the IFgraph comprises at least one node of the IFtree.

30. The compiler of claim 25, wherein the partitioner is further configured to:
 determine a number of boards of the cycle-based system required for the logic design based on an estimate of resources consumed by the set of nodes.

31. The compiler of claim 25, wherein partitioning the IFgraph comprises:
 performing an extended multi-level k-way partitioning of the IFgraph.

32. The compiler of claim 25, wherein the partitioner is further configured to:
  unroll all loops in code associated with the logic design.

33. A plurality of nodes to compile a logic design of a cycle-based system, comprising:
  a partitioner configured to:
    accept as input an intermediate form data flow graph (IFgraph) from an intermediate form data flow tree (IFtree) associated with the logic design;
    partition the IFgraph for each of at least three levels of hardware granularity of the cycle-based system to obtain a partitioned IFgraph, wherein the partitioning of the IFgraph comprises:
      coarsening the IFgraph to obtain a coarsened IFgraph for a first level of the at least three levels of hardware granularity;
      balancing a set of nodes of the coarsened IFgraph for the first level into a first subset and a second subset to obtain a balanced IFgraph for the first level;
      uncoarsening the balanced IFgraph for the first level to obtain an uncoarsened balanced IFgraph for the first level;
      coarsening the uncoarsened balanced IFgraph for the first level to obtain a coarsened IFgraph for a second level of the at least three levels of hardware granularity;
      balancing a set of nodes of the coarsened IFgraph for the second level into a third subset and a fourth subset to obtain a balanced IFgraph for the second level;
      uncoarsening the balanced IFgraph for the second level to obtain an uncoarsened balanced IFgraph for the second level;
      coarsening the uncoarsened balanced IFgraph for the second level to obtain a coarsened IFgraph for a third level of the at least three levels of hardware granularity;
      balancing a set of nodes of the coarsened IFgraph for the third level into a fifth subset and a sixth subset to obtain a balanced IFgraph for the third level; and
      uncoarsening the balanced IFgraph for the third level to obtain the partitioned IFgraph,
      wherein the first subset and the second subset are each within a predefined constraint of the cycle-based system, and
      wherein the predefined constraint comprises at least one selected from the group consisting of memory capacity, register capacity, bit-register capacity, static random access memory (SRAM) capacity, and number of processor instructions; and
    rewrite the IFtree based on the partitioned IFgraph; and
  a scheduler configured to schedule the set of nodes of the IFgraph on a processor array,
  wherein the partitioner is located on at least one of the plurality of nodes, and
  wherein the scheduler is executing on at least one of the plurality of nodes.

\* \* \* \* \*

UNITED STATES PATENT AND TRADEMARK OFFICE
CERTIFICATE OF CORRECTION

| | | |
|---|---|---|
| PATENT NO. | : 7,689,958 B1 | Page 1 of 1 |
| APPLICATION NO. | : 10/997196 | |
| DATED | : March 30, 2010 | |
| INVENTOR(S) | : Michael S. Ball | |

It is certified that error appears in the above-identified patent and that said Letters Patent is hereby corrected as shown below:

In claim 1, column 12 (line 61), after "partitioning", insert --using the processor of the computer--;

In claim 1, column 12 (line 63), delete "using the";

In claim 1, column 12 (line 64), delete "processor of the computer".

Signed and Sealed this

Thirty-first Day of August, 2010

David J. Kappos
*Director of the United States Patent and Trademark Office*